(12) United States Patent
Kawakita et al.

(10) Patent No.: US 9,912,122 B2
(45) Date of Patent: Mar. 6, 2018

(54) SEMICONDUCTOR OPTICAL DEVICE

(71) Applicant: FURUKAWA ELECTRIC CO., LTD., Tokyo (JP)

(72) Inventors: Yasumasa Kawakita, Tokyo (JP); Noriyuki Yokouchi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/682,692

(22) Filed: Aug. 22, 2017

(65) Prior Publication Data

US 2017/0353011 A1    Dec. 7, 2017

Related U.S. Application Data

(63) Continuation of application No. PCT/JP2016/056060, filed on Feb. 29, 2016.

(30) Foreign Application Priority Data

Mar. 6, 2015   (JP) ................. 2015-045197

(51) Int. Cl.
*H01S 5/34* (2006.01)
(52) U.S. Cl.
CPC ..................... *H01S 5/34* (2013.01)
(58) Field of Classification Search
CPC ....................................................... H01S 5/34
See application file for complete search history.

(56) References Cited

U.S. PATENT DOCUMENTS

| 5,253,264 A * | 10/1993 | Suzuki | B82Y 20/00 372/45.012 |
| 5,585,957 A | 12/1996 | Nakao et al. | |
| 5,689,358 A | 11/1997 | Nakao et al. | |
| 6,469,358 B1 * | 10/2002 | Martin | B82Y 20/00 257/184 |
| 2001/0043629 A1 * | 11/2001 | Sun | H01S 5/426 372/43.01 |

(Continued)

FOREIGN PATENT DOCUMENTS

| JP | 01-140781 | 6/1989 |
| JP | 07-221403 | 8/1995 |

(Continued)

OTHER PUBLICATIONS

International Search Report dated May 24, 2016 in PCT/JP2016/056060 filed Feb. 29, 2016 (with English Translation).

(Continued)

*Primary Examiner* — Casey Bryant
(74) *Attorney, Agent, or Firm* — Oblon, McClelland, Maier & Neustadt, L.L.P.

(57) ABSTRACT

A semiconductor optical device includes an active layer, the active layer including a plurality of quantum well layers having gain peak wavelengths different from one another in a layering direction thereof, and a plurality of barrier layers, wherein the quantum well layers and the barrier layers are alternately layered over each other, and an n-type dopant has been added in the plurality of quantum well layers having gain peak wavelengths different from one another and in the plurality of barrier layers.

20 Claims, 11 Drawing Sheets

(56) References Cited

U.S. PATENT DOCUMENTS

| | | | |
|---|---|---|---|
| 2006/0171437 A1* | 8/2006 | Takahashi | B82Y 20/00 |
| | | | 372/50.124 |
| 2006/0233213 A1* | 10/2006 | Choa | B82Y 20/00 |
| | | | 372/64 |
| 2007/0153855 A1 | 7/2007 | Suzuki et al. | |

FOREIGN PATENT DOCUMENTS

| | | |
|---|---|---|
| JP | 07-231144 | 8/1995 |
| JP | 11-068224 | 3/1999 |
| JP | 2002-368342 | 12/2002 |
| JP | 4005705 | 11/2007 |
| WO | WO 2006/075759 A1 | 7/2006 |

OTHER PUBLICATIONS

Written Opinion dated May 24, 2016 in PCT/JP2016/056060 filed Feb. 29, 2016.

J. Minch, et al., "Theory and Experiment of $In_{1-x}Ga_xAs_yP_{1-y}$ and $In_{1-x-y}Ga_xAl_yAs$ Long-Wavelength Strained Quantum-Well Lasers," May 1999, IEEE Journal of Quantum Electronics, vol. 35 No. 5, pp. 771-782.

\* cited by examiner

SHORT WAVELENGTH GAIN REGION | LONG WAVELENGTH GAIN REGION

SEMICONDUCTOR OPTICAL DEVICE

CROSS-REFERENCE TO RELATED APPLICATION(S)

This application is a continuation of International Application No. PCT/JP2016/056060, filed on Feb. 29, 2016 which claims the benefit of priority of the prior Japanese Patent Application No. 2015-045197, filed on Mar. 6, 2015, the entire contents of which are incorporated herein by reference.

BACKGROUND

The present disclosure relates to a semiconductor optical device.

A structure called "multiquantum well structure", the structure having plural quantum well layers (light emitting layers) layered over one another, has been widely used as an active layer of a semiconductor optical device, such as a semiconductor laser. As a technique for broadening a gain bandwidth of a semiconductor laser, layering plural quantum well layers over one another, the quantum well layers having slightly different thicknesses, has been known.

Further, as a technique for broadening a gain bandwidth of a semiconductor optical amplifier, arranging two quantum well layers having different gain peak wavelengths in a direction of propagation has been disclosed in Japanese Patent No. 4005705.

However, in both of: the case where multiple quantum well layers having slightly different thicknesses are layered over one another; and the case where quantum well layers having different gain peak wavelengths are arranged in the direction of propagation; when a difference among/between the respective gain peak wavelengths is increased, the gain is reduced at the wavelength between the peak wavelengths and flat gain characteristics are unable to be obtained. Therefore, the difference among/between the peak wavelengths of the respective quantum well layers needs to be made small.

However, when the difference among/between the peak wavelengths of the respective quantum well layers is made small, in broadening the flat gain bandwidth, there is a problem that multiple quantum well layers having different thicknesses will be required.

Further, even if multiple quantum well layers having peak wavelengths over a broad range and having different thicknesses are layered over one another, since quantum well layers having gain at a long wavelength side act as an absorber layer for light on a short wavelength side, it is difficult to broaden the gain bandwidth substantially.

The present disclosure has been made in view of the above, and an object thereof is to provide a semiconductor optical device having a broad gain bandwidth while having a simple configuration.

SUMMARY

It is an object of the present disclosure to at least partially solve the problems in the related art.

In some embodiments, a semiconductor optical device includes: an active layer, the active layer including a plurality of quantum well layers having gain peak wavelengths different from one another in a layering direction thereof, and a plurality of barrier layers, wherein the quantum well layers and the barrier layers are alternately layered over each other, and an n-type dopant has been added in the plurality of quantum well layers having gain peak wavelengths different from one another and in the plurality of barrier layers.

In some embodiments, a semiconductor optical device includes: a plurality of active layers arranged in a direction of propagation of light, the plurality of active layers including, in the direction of propagation of light, a plurality of quantum well layers having gain peak wavelengths different from one another, and a plurality of barrier layers, wherein the quantum well layers and the barrier layers are alternately layered over each other, and an n-type dopant has been added in the plurality of quantum well layers having gain peak wavelengths different from one another and in the plurality of barrier layers.

The above and other objects, features, advantages and technical and industrial significance of this disclosure will be better understood by reading the following detailed description of presently preferred embodiments of the disclosure, when considered in connection with the accompanying drawings.

DETAILED DESCRIPTION

Figure 1:
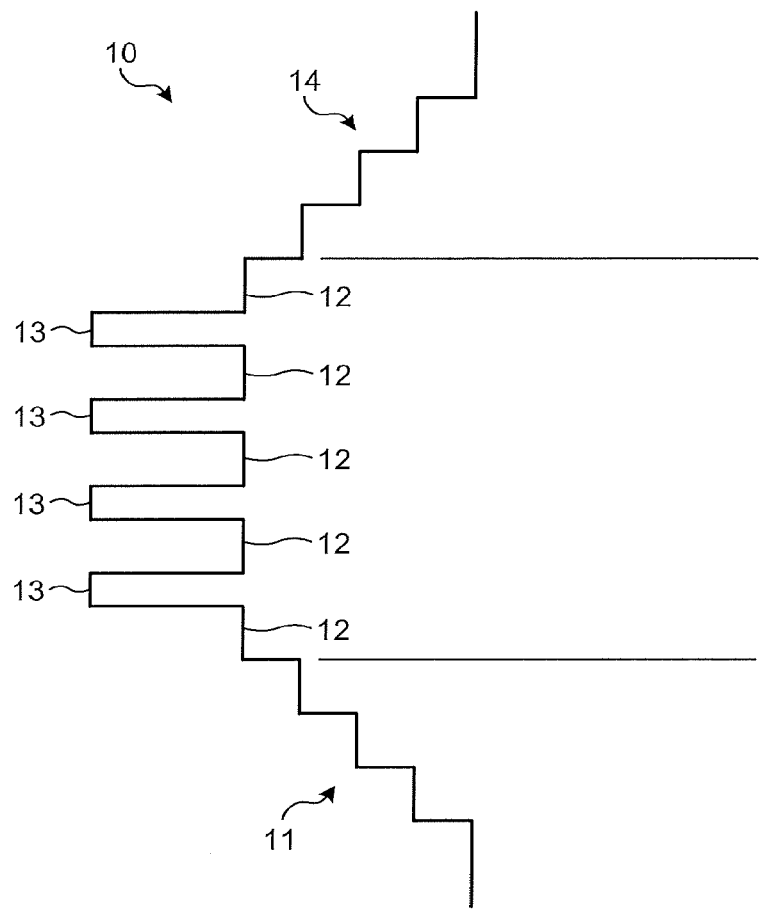
FIG. 1 is a schematic explanatory diagram of a layered structure of an active layer included in a semiconductor optical device according to a first embodiment.

Hereinafter, by reference to the drawings, semiconductor optical devices according to embodiments of the present disclosure will be described. The disclosure is not limited by these embodiments. Further, the same signs will be appended, as appropriate, to the same or corresponding elements in the drawings. Furthermore, it needs to be noted that the drawings are schematic, relations among dimensions of the respective elements, ratios among the respective elements, and the like may be different from the actual ones. A portion may be included, which has different dimensional relations and ratios among the drawings.

First Embodiment

First of all, a first embodiment of the present disclosure will be described. In the first embodiment, a layered structure of an active layer included in a semiconductor optical device according to an embodiment of the present disclosure will be described. FIG. 1 is a schematic explanatory diagram of a layered structure of an active layer 10 included in the semiconductor optical device according to the first embodiment.

The active layer 10 is interposed between, for example, an n-InP cladding layer and a p-InP cladding layer, and includes: quantum well layers 13 (light emitting layers) 13; barrier layers 12; and optical confinement layers 11 and 14 interposing these quantum well layers 13 and barrier layers 12 therebetween.

Each of the optical confinement layers 11 and 14 has a three stage (three layer) structure, and is configured such that bandgap wavelength ($\lambda$g) thereof is reduced as distance thereof from the quantum well layers 13 is increased. Specifically, the optical confinement layers 11 and 14 each having the three stage structure are GaInAsP layers having $\lambda$g of 1.05 μm, 1.1 μm, and 1.15 μm, and all having a thickness of 15 μm. The optical confinement layers 11 and 14 are undoped, and lattice-matches the n-InP cladding layer and p-InP cladding layer.

The quantum well layers 13 and the barrier layers 12 are alternately layered over each other, and in the first embodiment, four quantum well layers 13 and five barrier layers 12 are alternately layered over each other. That is, in the first embodiment, a multiquantum well structure thereof is formed of the four quantum well layers 13 and the five barrier layers 12.

Strains of the quantum well layers 13 formed of GaInAsP layers, with respect to InP crystal are each 1%, and thicknesses of two of the quantum well layers 13 at the optical confinement layer 11 side are each 4.0 nm, and thicknesses of two of the quantum well layers 13 at the optical confinement layer 14 side are each 5.8 nm. The four quantum well layers 13 have the same $\lambda$g, and emission peak wavelengths of spontaneously emitted light according to photoluminescence (PL) measurement are adjusted to be 1.545 μm for the quantum well layers each having the thickness of 5.8 nm and to be 1.49 μm for the quantum well layers each having the thickness of 4.0 nm. That is, in the first embodiment, the active layer 10 has the plural quantum well layers 13 having gain peak wavelengths different from one another in a layering direction thereof.

The barrier layers 12 formed of GaInAsP layers each have a strain of −0.3% with respect to InP crystal, $\lambda$g of 1.2 μm, and a thickness of 10 nm.

Further, all of the quantum well layers 13 and barrier layer 12 have been added with Se, which is an n-type dopant, and have n-type conductivity. A doping concentration therein is $1\times10^{17}$ cm$^{-3}$ to $5\times10^{18}$ cm$^{-3}$. The doping concentration is preferably $3\times10^{17}$ cm$^{-3}$ to $3\times10^{18}$ cm$^{-3}$. Any n-type dopant other than Se may be used, except for amphoteric dopants. The n-type dopant may be, for example, S or Si, instead.

In the layered structure of the active layer 10 used in the semiconductor optical device according to the first embodiment configured as described above, since the n-type dopant has been added in the quantum well layers 13 included in the active layer 10, a full width at half maximum of a wavelength band of a gain spectrum of the active layer 10 based on spontaneously emitted light emitted from the quantum well layers 13 is larger than that in an undoped case. Further, the active layer 10 has the plural quantum well layers 13 having gain peak wavelengths different from one another in the layering direction. As described above, due to the increase in the full width at half maximum and wavelength bands of the two quantum well layers 13 having different thicknesses from each other being superposed on each other, light having a broad gain bandwidth is able to be obtained.

Figure 2:
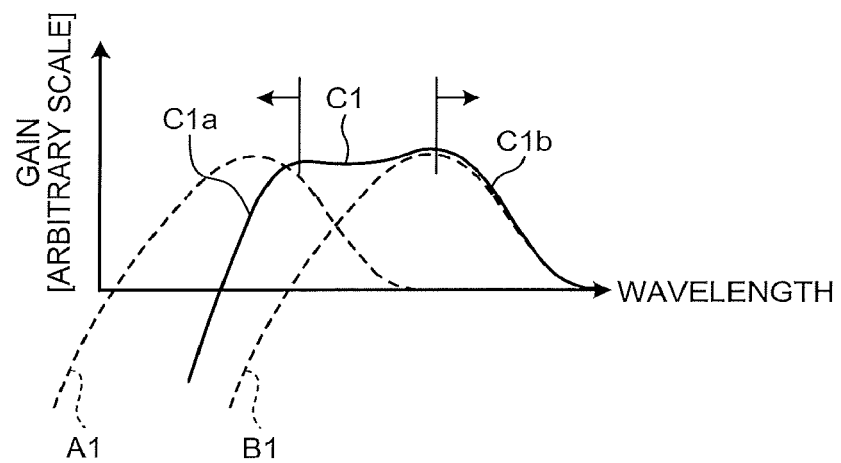
FIG. 2 is an explanatory diagram of a gain spectrum in a case where laser oscillation is caused based on spontaneously emitted light output from the active layer included in the semiconductor optical device according to the first embodiment.
Figure 3:
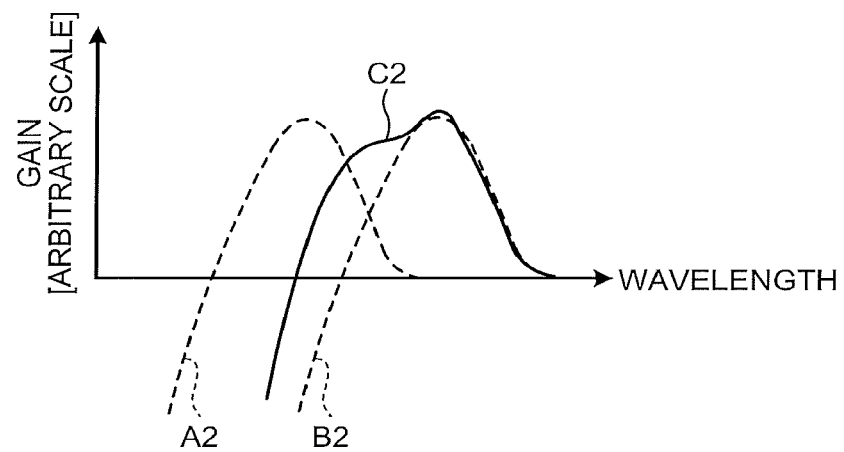
FIG. 3 is a schematic explanatory diagram of a gain spectrum in a case where laser oscillation is caused based on spontaneously emitted light output from a conventional active layer.
Figure 4:
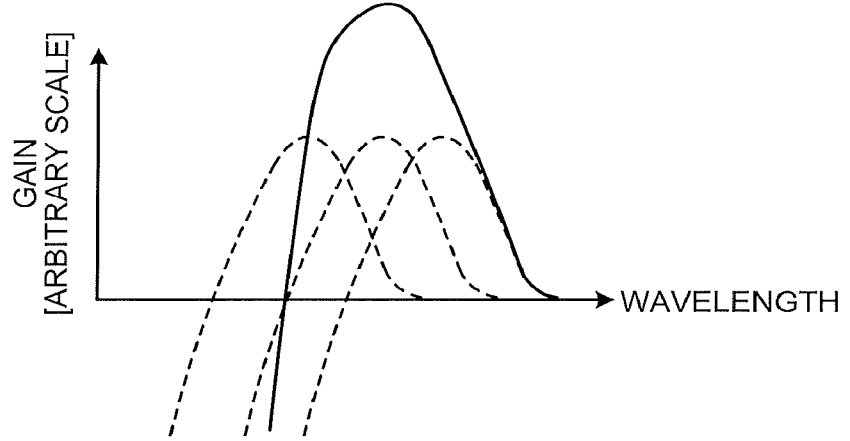
FIG. 4 is a schematic explanatory diagram of a gain spectrum in a case where laser oscillation is caused based on spontaneously emitted light output from a conventional active layer.

FIG. 2 is an explanatory diagram of a gain spectrum in a case where oscillation is carried out based on spontaneously emitted light output from the active layer 10 that the semiconductor optical device according to the first embodiment has. FIG. 3 is a schematic explanatory diagram of a gain spectrum in a case where oscillation is caused based on spontaneously emitted light output from a conventional active layer. FIG. 4 is a schematic explanatory diagram of a gain spectrum in a case where oscillation is caused based on spontaneously emitted light output from a conventional active layer.

In order to measure a gain spectrum when laser oscillation is caused based on spontaneously emitted light, spontaneously emitted light output when electric current equal to or less than a laser oscillation threshold current is supplied may be measured, and the technique disclosed by J. Minch et al. in "Theory and Experiment of In1-xGaxAsyP1-y and In1-x-yGaxAlyAs Long-Wavelength Strained Quantum-Well Lasers", IEEE J. Quantum Electron. 35, pp. 771 (1999), may be used.

A wavelength band A1 indicated with a broken in FIG. 2 is a wavelength band of light obtained by the quantum well layers each having the thickness of 4.0 nm, and a wavelength band B1 indicated with another broken line in FIG. 2 is a wavelength band of light obtained by the quantum well layers 13 each having the thickness of 5.8 nm. Since the n-type dopant has been added to the quantum well layers 13, full widths at half maximum of these wavelength bands A1 and B1 are broad. That is, bottom portions of the wavelength bands A1 and B1 of light output from the quantum well layers 13 are also broad.

Since light emitted from the active layer 10 is light resulting from the two wavelength bands A1 and B1 being superposed on each other, the two wavelength bands A1 and B1 having such broad full widths at half maximum; the gain bandwidth of the wavelength band of the light emitted from the active layer 10 is broad as illustrated by a wavelength band C1 of a solid line in FIG. 2. In other words, the light emitted from the two quantum well layers 13 has the first wavelength band A1 and the second wavelength band B1 that is a longer wavelength band than the first wavelength band A1, the bottom portion at the long wavelength side of the first wavelength band A1 is superposed on the bottom portion at the short wavelength side of the second wavelength band B1, and the wavelength band C1 having a broad bandwidth is formed. As described above, in the first embodiment, since the respective gain bandwidths of the two quantum well layers are broad, even if the number of quantum well layers having gain peak wavelengths different from each other is two, a broad gain bandwidth that is sufficiently flat is able to be obtained.

In the gain curve versus wavelength, the gain curve representing the wavelength band C1; a falling curve C1a will be prescribed as a falling curve at the short wavelength side, and a curve C1b as a falling curve at a long wavelength side. The falling curve C1a is a curve at a shorter wavelength side (a side indicated with a left arrow in the figure) than the peak at the short wavelength side of the gain curve representing the wavelength band C1, and is a gain curve of a wavelength bandwidth where the gain is decreased. The falling curve C1b is a curve at a longer wavelength side (a side indicated with a right arrow in the figure) than the peak at the long wavelength side of the gain curve representing the wavelength band C1, and is a gain curve of a wavelength bandwidth where the gain is decreased.

As illustrated in FIG. 2, the gain between the falling curve C1a at the short wavelength side and the falling curve C1b at the long wavelength side, in the gain curve representing the wavelength band C1, is positive. Further, the gain curve between the falling curve C1a at the short wavelength side and the falling curve C1b at the long wavelength side, in the gain curve representing the wavelength band C1, does not become higher than the falling curve C1a at the short wavelength side and the falling curve C1b at the long wavelength side. That is, the gain in the gain curve between the falling curve C1a at the short wavelength side and the falling curve C1b at the long wavelength side is smaller than the maximum gain value in the falling curve C1a at the short wavelength side and the maximum gain value in the falling curve C1b at the long wavelength side. Furthermore, the degree of falling of the falling curve C1a at the short wavelength side is steeper than that of the falling curve C1b at the long wavelength side, in the gain curve representing the wavelength band C1. The degree of falling being steep means that the decrease in the gain versus a change in wavelength is large.

Further, the quantum well layers 13 having these two types of thicknesses are preferably formed such that their gain peak wavelengths contact each other. Specifically, for example, the two wavelength bands are preferably superposed on each other at a wavelength of a value that is half their gain peaks.

On the contrary, since a conventional layered structure has not been added with an n-type dopant, a full width at half maximum thereof is narrow, and as illustrated in FIG. 3, bottom portions of wavelength bands A2 and B2 in a gain spectrum in a case where laser oscillation is caused based on spontaneously emitted light emitted from quantum well layers are not broad, and a gain bandwidth of a wavelength band C2 of light resulting from superposition of the wavelength bands A2 and B2 of light is narrow.

Further, as illustrated in FIG. 4, even in a conventional layered structure, by the number of quantum well layers having gain peak wavelengths different from one another being increased, the gain bandwidth is able to be broadened, but in this case, the number of quantum well layers is increased, and manufacture thereof becomes difficult if a strain of the well layers is high. That is, the layered structure according to the first embodiment enables light having a broad gain bandwidth to be emitted despite its simple configuration with a comparatively small number of quantum well layers.

Although the case where the thicknesses of the quantum well layers are different from one another has been described with respect to the first embodiment, wavelength bands of light emitted from quantum well layers may be made different from one another by a configuration, in which compositions of mixed crystal (GaInAsP, herein) forming a quantum well differ from one another. For example, the composition of the quantum well layers is not limited to GaInAsP, and wavelength bands of light emitted from quantum well layers are able to be made different from one another in a multiquantum well structure using other mixed crystal, such as AlGaInAs on an InP substrate, or AlGaAs or GaInAs on a GaAs substrate.

Second Embodiment

Next, a second embodiment of the present disclosure will be described. The second embodiment is different from the first embodiment in that plural active layers used in a semiconductor optical device according to the second embodiment are arranged in a direction of propagation of light, and plural quantum well layers having gain peak wavelengths different from one another are formed in the direction of propagation of light.

Figure 5:
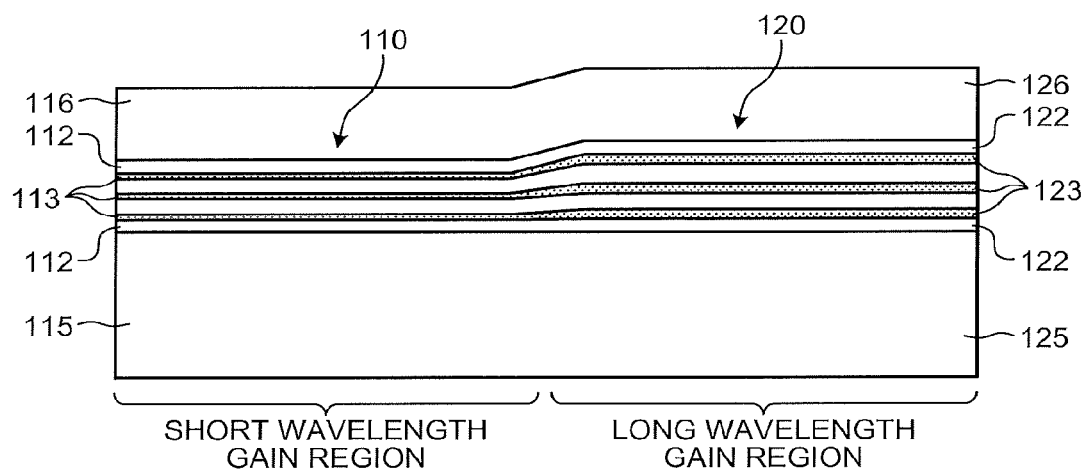
FIG. 5 is a side view illustrating an outline of a layered structure of plural active layers included in a semiconductor optical device according to a second embodiment.

FIG. 5 is a side view illustrating an outline of a layered structure of plural active layers 110 and 120 that the semiconductor optical device according to the second embodiment has. This layered structure has n-InP cladding layers 115 and 125, optical confinement layers (not illustrated), barrier layers 112 and 122, quantum well layers 113 and 123, and p-InP cladding layers 116 and 126.

The active layers 110 and 120 are arranged side by side in the direction of propagation of light. These active layers 110 and 120 respectively have the quantum well layers 113 and 123 having thicknesses different from each other. In the two quantum well layers 113 and 123 having thicknesses different from each other, the thinner quantum well layer 113 emits light having a gain peak wavelength shorter than that of the thicker quantum well layer 123. That is, in the layered structure of the second embodiment, a region of the active layer 110 is a short wavelength gain region, and a region of the active layer 120 is a long wavelength gain region.

Structures of the active layers 110 and 120 are all multiquantum well structures formed of GaInAsP, a gain peak wavelength of the long wavelength gain region is 1.57 μm, and a gain peak wavelength of the short wavelength gain region is 1.52 μm. Further, Se is added to each of the quantum well layers 113 and 123 and barrier layers 112 of the multiquantum well structure when the layer is grown such that a concentration therein becomes $5 \times 10^{17}$ cm$^{-3}$.

A method of manufacturing the layered structure of the active layers 110 and 120 of the second embodiment is as follows.

Figure 6:
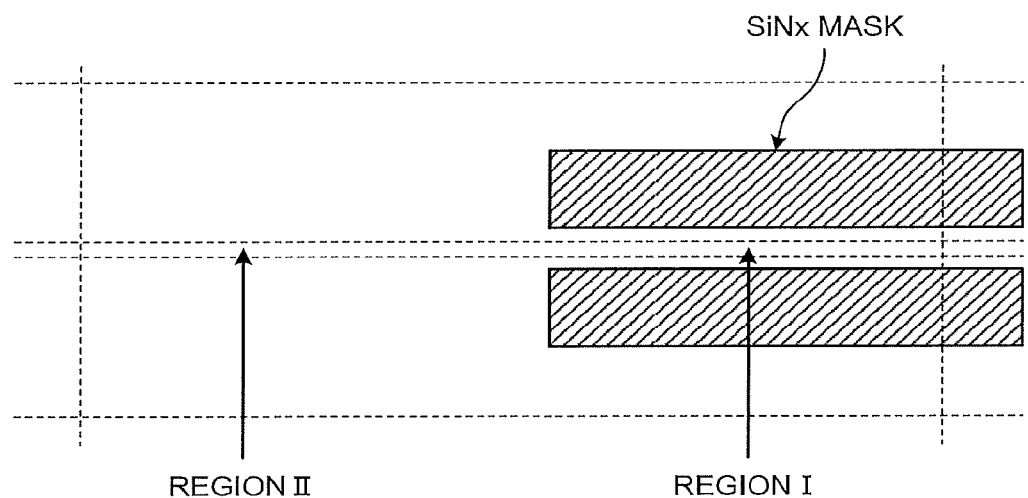
FIG. 6 is an explanatory diagram of a method of manufacturing the active layers included in the semiconductor optical device according to the second embodiment.

Firstly, SiNx is deposited on an n-InP substrate, and patterning is carried out as illustrated in FIG. 6 by use of a normal photolithography process. In a region I interposed between SiNx masks, an active layer selectively grows thickly into the long wavelength gain region illustrated in FIG. 5, and a region II without a mask becomes the short wavelength gain region. By reactive ion etching (CF$_4$ gas), a pattern is transferred onto the SiNx masks.

After photoresists are removed, growth of each layer is continuously carried out as described below in a metalorganic chemical vapor deposition (MOCVD) apparatus. The n-InP buffer and cladding layers 115 and 125 (n=1×10$^{18}$ cm$^{-3}$, thickness: 0.5 μm), a GaInAsP/GaInAsP multiquantum well structure (quantum well layer thickness: 3.6 nm, barrier layer thickness: 10 nm, λg of barrier layer=1.2 μm), and a p-InP cladding layer (p=1×10$^{18}$ cm$^{-3}$, thickness: 0.1 μm) are grown in order.

The above described thicknesses are thicknesses (film thicknesses) of layers grown in a flat region without the above mentioned SiNx masks, and in the region I interposed between the SiNx masks, thicknesses (film thicknesses) are about 1.5 times as thick. Thus, a gain peak wavelength of a long wavelength gain region is longer than that of a short wavelength gain region by 50 nm toward a long wavelength side.

Since the layered structure according to the second embodiment configured as described above has the plural (two) quantum well layers 113 and 123 having gain peak wavelengths different from each other in the direction of propagation of light, and the n-type dopant has been added to the plural quantum well layers 113 and 123; the full width at half maximum of light emitted from each of the quantum well layers 113 and 123 is broad. That is, the bottom portions of the wavelength band of light emitted from each of the quantum well layers 113 and 123 are broad. Since the superposition between these two optical wavelength bands is the light emitted from the whole active layers, light having a broad gain bandwidth is able to be obtained.

Further, the above described two quantum well layers 113 and 123 are preferably formed such that their gain peak wavelengths contact each other.

In the second embodiment, although the case where the plural quantum well layers 113 and 123 having thicknesses different from each other are formed in the direction of propagation has been described, plural quantum well layers having compositions different from one another may be formed in the direction of propagation.

Furthermore, a configuration may be adopted, in which a gain bandwidth is broadened by: thicknesses or compositions of plural quantum well layers being discretely varied in a direction of propagation of light; and plural beams of light having discrete gain peak wavelengths corresponding to the respective thicknesses or respective compositions being generated thereby.

Third Embodiment

Figure 7:
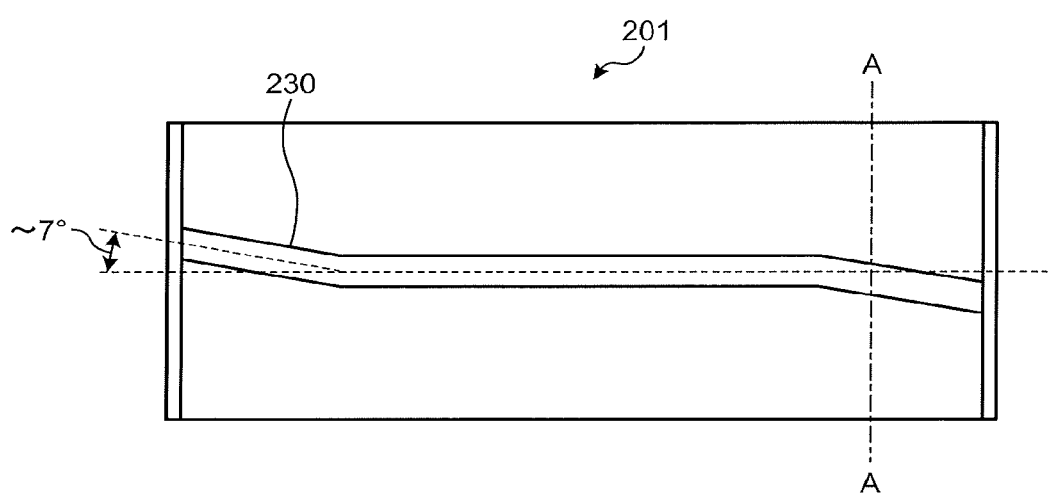
FIG. 7 is a plan view illustrating an outline of a semiconductor optical device according to a third embodiment.
Figure 8:
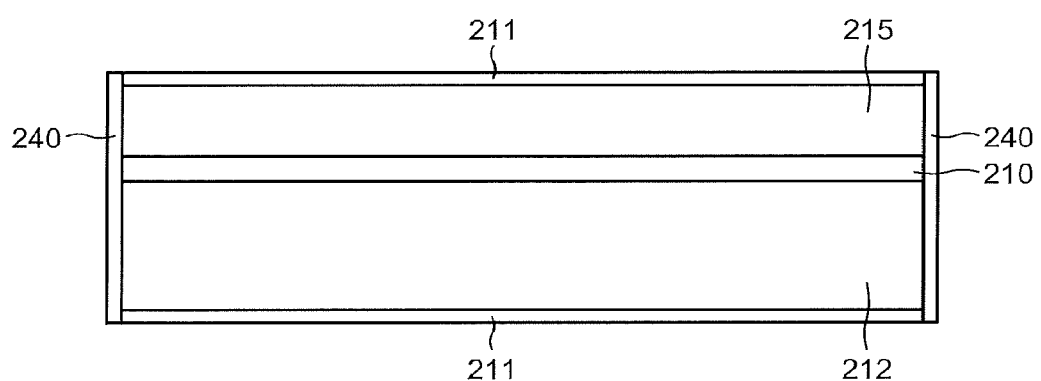
FIG. 8 is a side view illustrating the outline of the semiconductor optical device according to the third embodiment.
Figure 9:
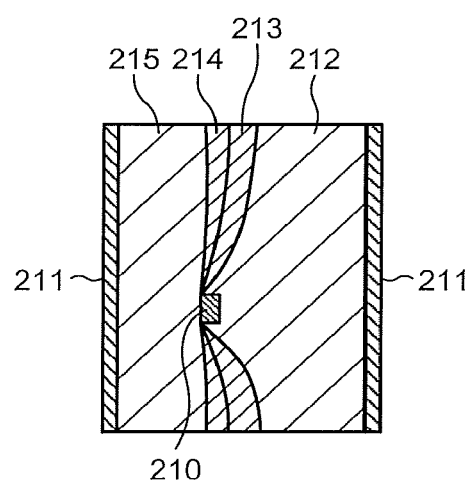
FIG. 9 is an A-A cross sectional view of the semiconductor optical device illustrated in FIG. 7.

Next, a third embodiment of the present disclosure will be described. A semiconductor optical device 201 according to the third embodiment is a semiconductor optical amplifier (SOA). FIG. 7 is a plan view illustrating an outline of the semiconductor optical device 201 according to the third embodiment. FIG. 8 is a side view illustrating the outline of the semiconductor optical device 201 according to the third embodiment. FIG. 9 is an A-A cross sectional view of the semiconductor optical device 201 illustrated in FIG. 7.

The semiconductor optical device 201 has an active layer 210 serving as an embedded optical waveguide, and incident and emitting facets of the optical waveguide are a bending waveguide 230 that is about 7° with respect to a normal direction of cleavage planes (see FIG. 7 to FIG. 9). Further, a nonreflective coating film 240 having a reflectivity equal to or less than 1% is formed on each of the incident and emitting facets. A length of the waveguide is 1 mm, and a width of the waveguide (a width of the active layer 210) is 2 μm for realization of single mode propagation.

Further, the active layer 210 that the semiconductor optical device of the third embodiment has is formed of GaInAsP layers. This active layer 210 is configured to include quantum well layers having thicknesses different from one another in a layering direction thereof, as described with respect to the first embodiment. Furthermore, a specific layered structure of the semiconductor optical device includes, as illustrated in FIG. 9, electrodes 211, an n-InP cladding layer 212, a p-InP current blocking layer 213, an n-InP current blocking layer 214, a p-InP cladding layer 215, and the active layer 210.

The semiconductor optical device 201 (SOA) according to the third embodiment configured as described above enables, similarly to the effects described with respect to the first embodiment, realization of an SOA having a broad gain bandwidth.

In the third embodiment, although the case where the active layer 210 includes the quantum well layers having thicknesses different from one another in the layering direction has been described, the third embodiment is not limited to this case, and may be configured to include plural active layers having gain peak wavelengths different from one another in the direction of propagation of light.

Fourth Embodiment

Figure 10:
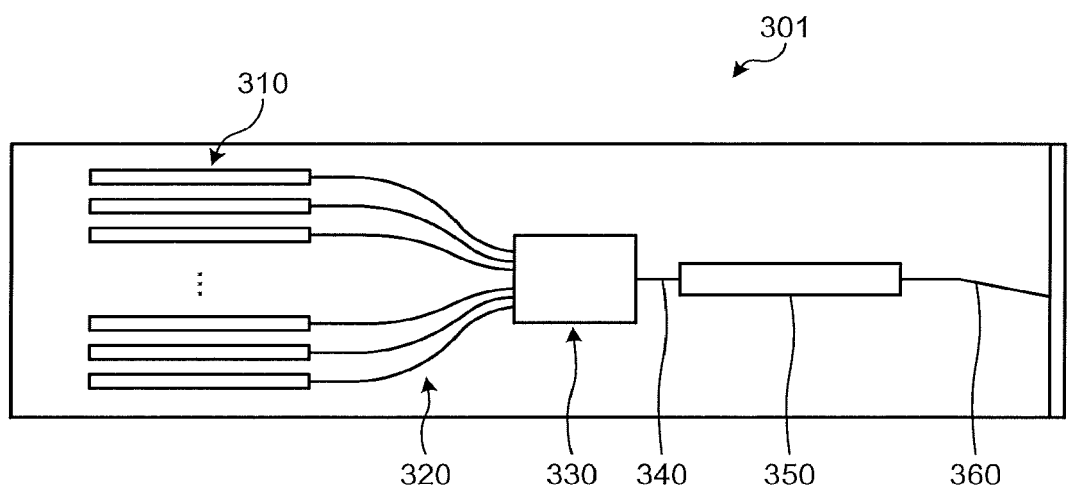
FIG. 10 is a plan view illustrating an outline of a semiconductor optical device according to a fourth embodiment.

Next, a fourth embodiment of the present disclosure will be described. A semiconductor optical device 301 according to the fourth embodiment is a wavelength-tunable laser. FIG. 10 is a plan view illustrating an outline of the semiconductor optical device 301 according to the fourth embodiment.

The semiconductor optical device 301 includes: twelve distributed feed-back (DFB) lasers 310; plural waveguides 320 that guide light output from the DFB lasers 310; an optical coupler 330 that couples light from these plural waveguides 320 together into a single waveguide; a waveguide 320 that guides light output from the optical coupler 330; an SOA 350 that amplifies and outputs light input from a waveguide 340; and a waveguide 360 that guides light output from the SOA 350.

All of the DFB lasers 310, the optical coupler 330, the SOA 350, and the waveguides 320, 340, and 360 connecting them together have an embedded structure. The DFB lasers 310 and the SOA 350 have quantum well layers and barrier layers of the same configurations, and the waveguides 320 and the optical coupler 330 are transparent waveguides with small absorption loss.

Each of the twelve DFB lasers 310 has a diffraction grating formed therein so as to oscillate with a wavelength difference of about 3.5 nm, and by an operating temperature being controlled at a central temperature (for example, 40° C.)±20° C., wavelength control is realized in each of the DFB lasers 310 in a range of ±2 nm. Since the oscillation wavelengths of the respective DFB lasers 310 differ from one another by 3.5 nm, by a particular one of the DFB lasers 310 being oscillated and the whole device being kept under a desired temperature, only an arbitrary wavelength is able to be obtained from a wavelength range over about 40 nm.

In the fourth embodiment, since all of the active layers of the DFB lasers 310 and SOA 350 are the same, characteristics at the long wavelength side may be inferior to those at the wavelength around the center. For example, by injection of electric current in the SOA, the gain peak may shift to the short wavelength side than that of light output from the DFB lasers. Thus, sufficient gain is obtained at the short wavelength side, but the gain tends to be saturated at the long wavelength side. Therefore, in order to obtain high power sufficiently in these wavelength regions, the injection current to the SOA needs to be increased. Thus, in the fourth embodiment, the quantum well layers included in the active layers of the DFB lasers 310 and SOA 350 are configured to be formed of six layers; the quantum well layers are GaInAsP layers each having a strain of 1%, three lower layers of the GaInAsP layers having a thickness of 5.8 nm each, and three upper layers thereof having a thickness of 4.0 nm each; and the barrier layers are each a GaInAsP layer having a strain of −0.3%, 2 g=1.2 μm, and a thickness of 10 nm. Further, Se has been added in these quantum well layers and barrier layers to be at a concentration of $5 \times 10^{17}$ cm$^{-3}$.

The six GaInAsP layers of the quantum well layers have the same λg, and emission peak wavelengths according to photoluminescence (PL) measurement are adjusted to be 1.56 μm for a quantum well layer having a thickness of 5.5 nm and to be 1.51 μm for a quantum well layer having a thickness of 3.6 nm. Further, Se has been added in all of the quantum well layers and barrier layers to be at a concentration of $n = 5 \times 10^{17}$ cm$^{-3}$.

The semiconductor optical device 301 (wavelength-tunable laser) according to the fourth embodiment configured as described above enables the gain bandwidth of the SOA 350 to be made broader than a range of 40 nm, over which the wavelength of DFB lasers 310 is varied, and thus, the above described influence of the gain saturation is able to be reduced or prevented and high power is able to be obtained sufficiently over the range, over which the wavelength of the DFB lasers 310 is varied.

Fifth Embodiment

Figure 11:
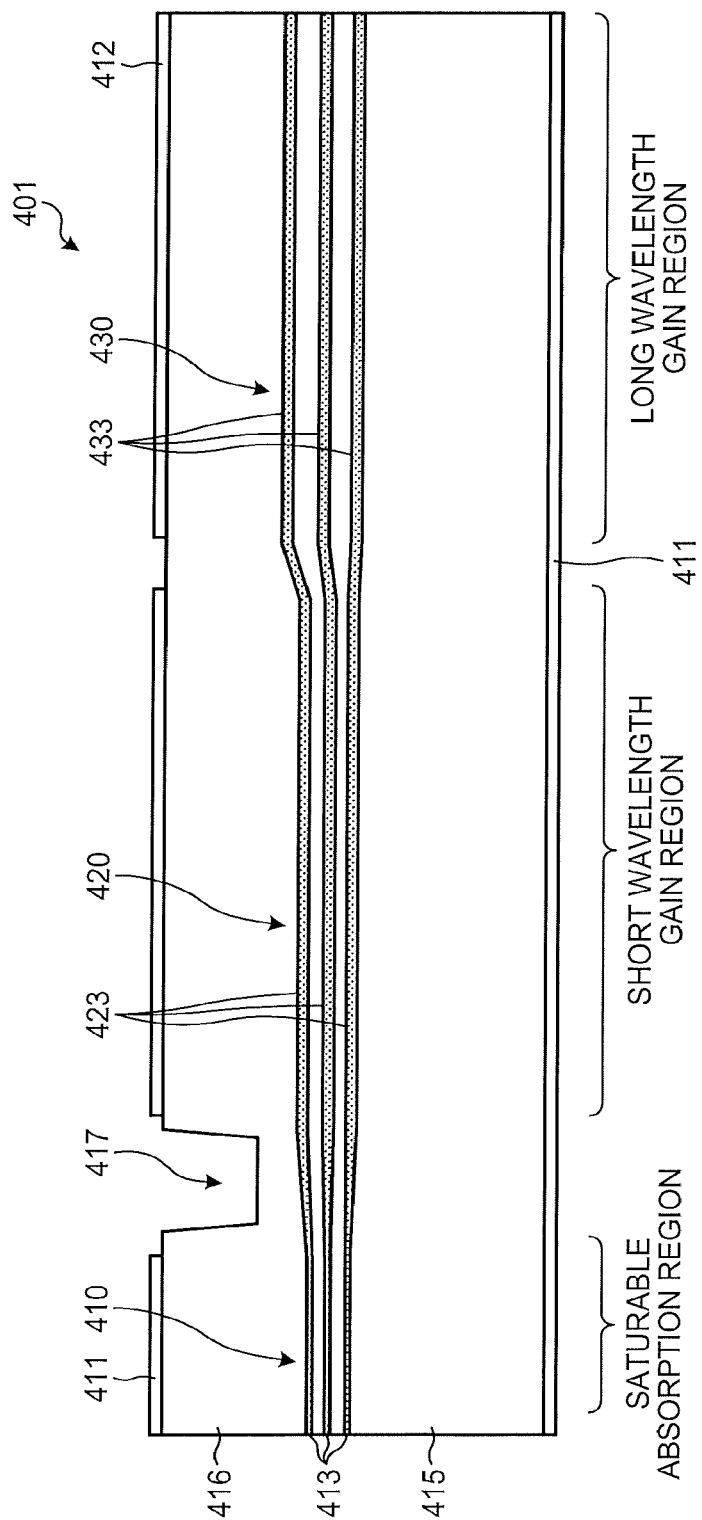
FIG. 11 is a side view illustrating an outline of a semiconductor optical device according to a fifth embodiment.

Next, a fifth embodiment of the present disclosure will be described. A semiconductor optical device 401 according to the fifth embodiment is a mode-locked laser. FIG. 11 is a side view illustrating an outline of the semiconductor optical device 401 according to the fifth embodiment.

The semiconductor optical device 401 has active layers serving as embedded optical waveguides, and has three active layers 410, 420, and 430 having quantum well layers 413, 423, and 433 having thicknesses different from one another, along a direction of propagation of light. As illustrated in FIG. 11, the active layer 410 at the left side is a saturable absorption region (having a waveguide length of 100 μm), the active layer 420 at the center is a short wavelength gain region (having a waveguide length of 400 μm), and the active layer 430 at the right side is a long wavelength gain region (having a waveguide length of 400 μm).

These active layers 410, 420, and 430 are interposed between an n-InP cladding layer 415 and a p-InP cladding layer 416, a lower electrode (n-side electrode) is formed on a lower surface of the n-InP cladding layer 415, and an upper electrode (p-side electrode) 412 is formed on an upper surface of the p-InP cladding layer 416. Further, the semiconductor optical device 401 has a separation groove 417 provided therein, obtained by a part of the p-InP cladding layer 416 being etched in order for sufficient electric separating resistance to be obtained between the saturable absorption region and the gain regions.

All of the active layers 410, 420, and 430 have a multi-quantum well structure formed of GaInAsP layers, and this structure is, similarly to the above described second embodiment, manufactured by use of a selective region growing method, in which masks having different widths are formed on a part of a substrate. Further, Se has been added in the multiquantum well structure to be at a concentration of $n = 5 \times 10^{17}$ cm$^{-3}$. In each of the regions, emission peak wavelengths measured by photoluminescence (PL) are: 1.45 μm in the saturable absorption region; 1.56 μm in the long wavelength gain region; and 1.51 μm in the short wavelength gain region.

The semiconductor optical device 401 according to the fifth embodiment configured as described above operates as the mode-locked laser by Q-switching the saturable absorption region, and similarly to the effects described with respect to the second embodiment, the semiconductor optical device 401 is able to output light having a broad bandwidth.

The present disclosure is not limited by the above described embodiments. Those configured by combination of respective elements described above as appropriate are also included in the present disclosure. Moreover, further effects and modifications can be derived easily by those skilled in the art. Therefore, broader aspects of the present disclosure are not limited to the above described embodiments, and various modifications may be made.

First Example

Next, first to fifth examples implemented in order for the effects of the present disclosure to be confirmed will be described. Firstly, the first example will be described. In the first example, as listed in Table 1, the numbers of layers and thicknesses of quantum well layers, and n-type doping concentrations were set, and layered structures to be evaluated were manufactured.

TABLE 1

|  | First inventive example | First comparative example | Second Comparative example | Third comparative example |
|---|---|---|---|---|
| Quantum well layers (thickness and number of layers) | 4.0 nm × 2 layers 5.8 nm × 2 layers | 6.0 nm × 4 layers | 4.0 nm × 2 layers 5.8 nm × 2 layers | 6.0 nm × 4 layers |
| N-type doping concentration | N = 5 × 10$^{17}$ cm$^{-3}$ | Undoped | Undoped | N = 5 × 10$^{17}$ cm$^{-3}$ |

As a first inventive example, a layered structure having the active layer 10 described with respect to the first embodiment was manufactured.

As a first comparative example, a layered structure, which had four quantum well layers each having a thickness of 6.0 nm, and did not have any n-type dopant added in the quantum well layers and barrier layers, was manufactured.

As a second comparative example, a layered structure, which had the same number of quantum well layers and the same thicknesses thereof as the first inventive example, and did not have any n-type dopant added in the quantum well layers and barrier layers, was manufactured.

As a third comparative example, a layered structure, which had four quantum well layers each having a thickness of 6.0 nm, and had the same n-type dopant as the first inventive example added (n=5×10$^{17}$ cm$^{-3}$) in the quantum well layers and barrier layers, was manufactured.

The rest of the configurations of the first to third comparative examples was the same as that of the first inventive example.

Figure 12:
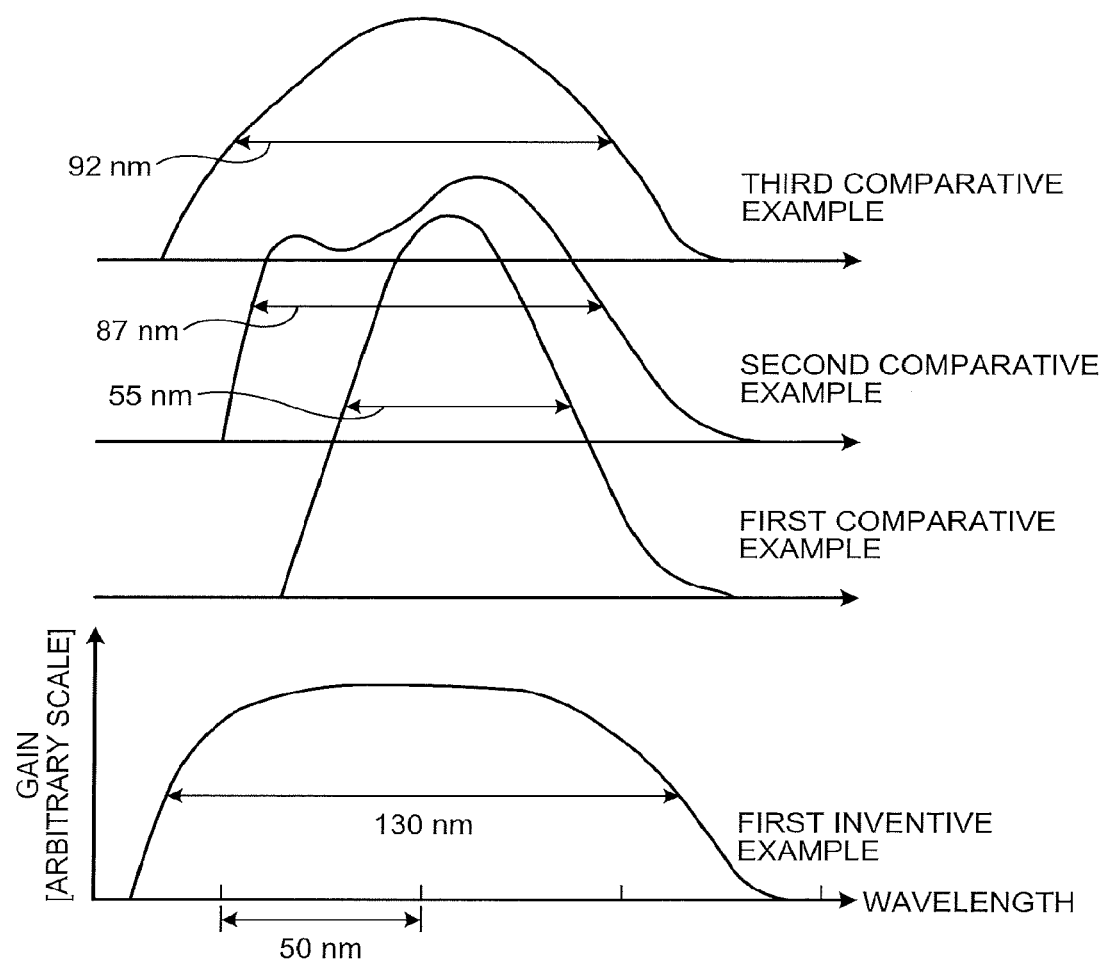
FIG. 12 is a diagram illustrating experimental results of a first example.

Gain wavelength bands of all of the above described layered structures were measured by use of fabry-perot laser structures made by growth with a metalorganic chemical vapor deposition (MOCVD) method on n-InP substrates. Measurement results of gain spectra are illustrated in FIG. 12. In FIG. 12, each wavelength width illustrated with a two-way arrow represents a full width at half maximum.

The following is found from FIG. 12. The first inventive example has the broadest full width at half maximum (full width at half maximum gain), has a single peak, and a flat gain wavelength band. Further, the first comparative example has the highest gain peak power, but the narrowest full width at half maximum. The second comparative example has two clear gain peaks observed therein, and has a narrower full width at half maximum than the first inventive example. The third comparative example has a broader full width at half maximum than the second comparative example, but has a gain wavelength band with flatness inferior to the first example.

Accordingly, by a layered structure having quantum well layers that have different thicknesses (gain peak wavelengths) and that have been added with an n-type dopant, light that has a broad and flat gain bandwidth is able to be obtained.

Figure 13:
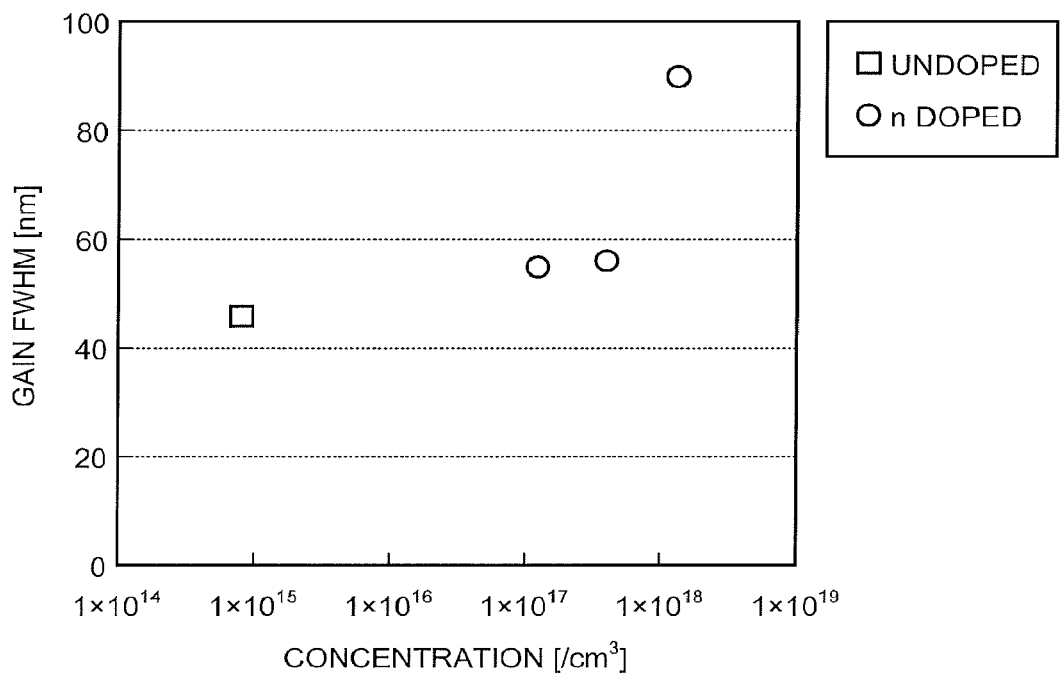
FIG. 13 is a diagram illustrating experimental results of the first example.

Next, with respect to the first inventive example, results of changing the doping concentration of the n-type dopant and measuring full widths at half maximum gain are illustrated in FIG. 13. The horizontal axis represents the doping concentration, and the vertical axis represents the full width at half maximum of the gain wavelength band. The undoped plot is the result of measurement for the second comparative example. Increase of the full widths at half maximum was confirmed in the layered structures that have been added with the n-type dopant to be at concentrations equal to or greater than $1 \times 10^{17}$ cm$^{-3}$. Further, the flatness was also confirmed to be satisfactory at $1 \times 10^{17}$ cm$^{-3}$ or higher; and at $5 \times 10^{17}$ cm$^{-3}$ or higher in particular, any spectral shape protruding downward was not observed.

Second Example

Next, the second example will be described. In the second example, the layered structure described with respect to the second embodiment was manufactured as a second inventive example.

Further, as a fourth comparative example, an active layer was manufactured without use of the SiNx masks in the second embodiment, the active layer having a uniform quantum well structure with a thickness of 4.5 nm, the quantum well structure not having been added with any n-type dopant. Thereafter, after the SiNx masks were removed, a p-InP cladding layer (p=$1 \times 10^{18}$ cm$^{-3}$, having a thickness of 1.0 μm) and a p-GaInAsP cap layer (λg=1.3 μm, having a thickness of 0.5 μm) were layered. The gain wavelength of the fourth comparative example with respect to the direction of propagation is substantially uniform.

The active layer of the fourth comparative example also has a multiquantum well structure formed of GaInAsP, and a gain peak wavelength of 1.56 μm, and an impurity concentration is $1 \times 10^{16}$ cm$^{-3}$ or less in the active layer. The rest of the configuration of the fourth comparative example was the same as that of the second inventive example.

Figure 14:
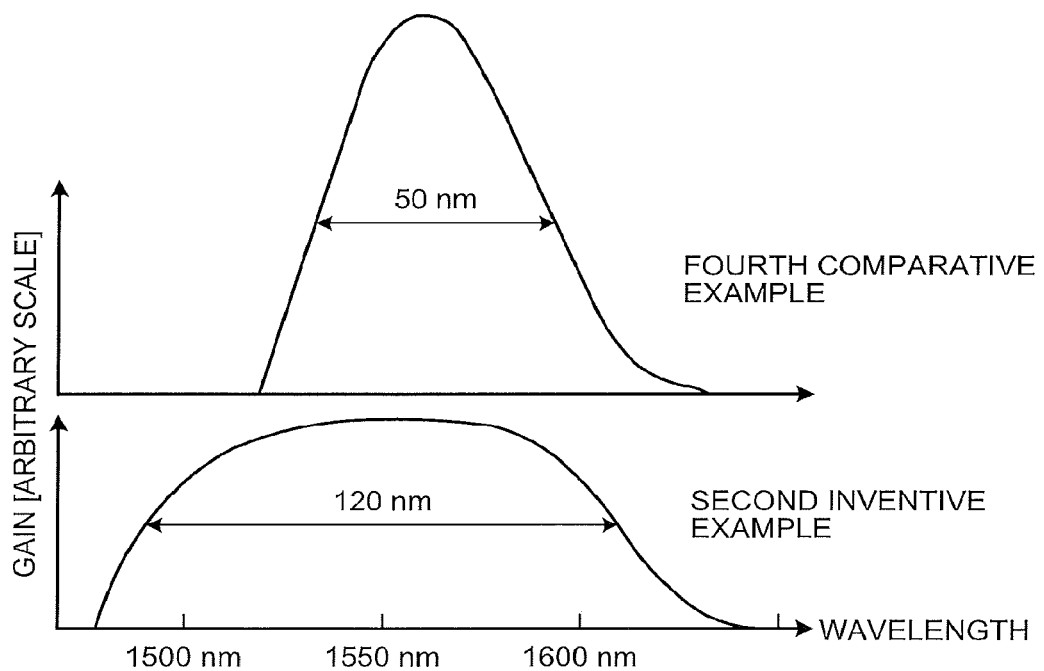
FIG. 14 is a diagram illustrating experimental results of a second example.

Measurement results for a gain wavelength band of the layered structure of the second inventive example are illustrated in FIG. 14. As illustrated in FIG. 14, the second inventive example had a single peak, and a broad full width at half maximum, while the fourth comparative example had a narrower full width at half maximum than the second inventive example.

Third Example

Next, the third example will be described. An active layer of a third inventive example had, similarly to the above described first inventive example, a multiquantum well structure that included quantum well layers, which had thicknesses different from one another, and that had been added with an n-type dopant. Specifically, the semiconductor optical device 201 (SOA) described with respect to the third embodiment was used as the third inventive example.

As a fifth comparative example, a semiconductor optical device (SOA), which had quantum well layers with a uniform thickness like the above described first comparative example and without any n-type dopant added therein, was manufactured. The rest of the configuration of the fifth comparative example was the same as the configuration of the third inventive example.

Figure 15:
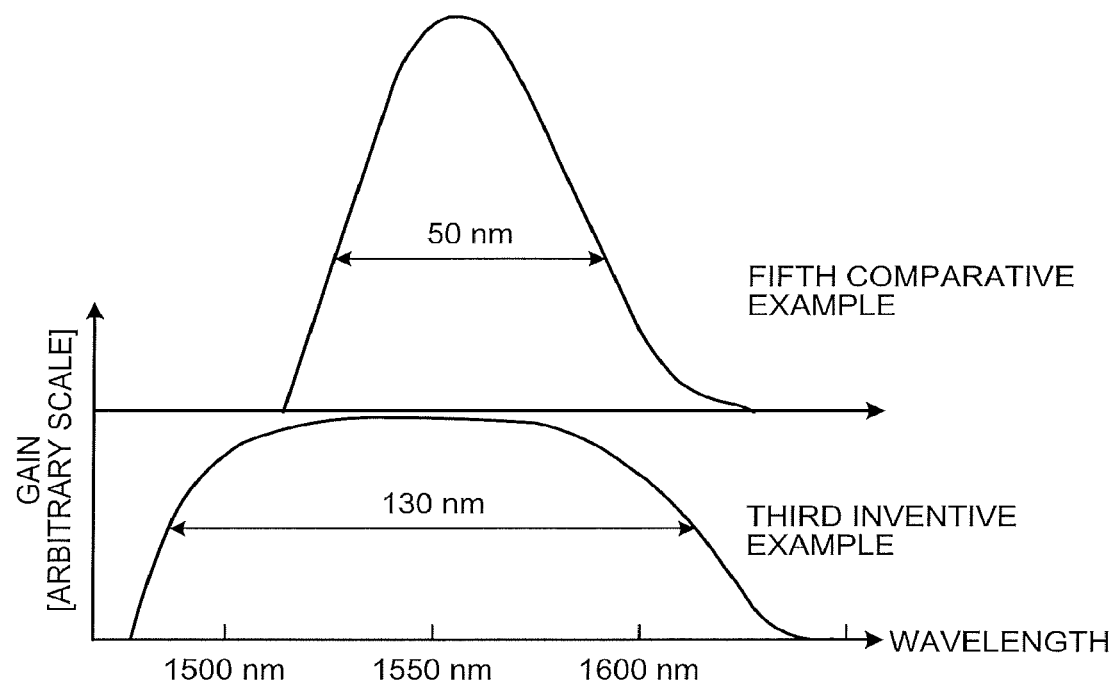
FIG. 15 is a diagram illustrating experimental results of a third example.

Respective gain spectrum results, which were found from output optical power obtained by electric current of 500 mA being injected into these devices and incident wavelengths being varied, are illustrated in FIG. 15. As illustrated in FIG. 15, the third inventive example has a single peak, and a full width at half maximum of gain (a wavelength width where the gain is half the peak) is 130 nm, while the fifth comparative example had a full width at half maximum of gain of 50 nm. That is, in the third inventive example 3, an effect of increasing the full width at half maximum by 80 nm was obtained.

Fourth Example

Next, the fourth example will be described. As a fourth inventive example, the semiconductor optical device 301 (wavelength-tunable laser) described with respect to the fourth embodiment was manufactured.

As a sixth comparative example, a semiconductor optical device was manufactured, which was configured to have: uniform six quantum well layers each having a thickness of 4.5 nm and having a PL peak wavelength of 1.54 μm; and undoped well layers and barrier layers (multiquantum well structure). The rest of the configuration of the sixth comparative example was the same as the configuration of the fourth inventive example.

Figure 16:
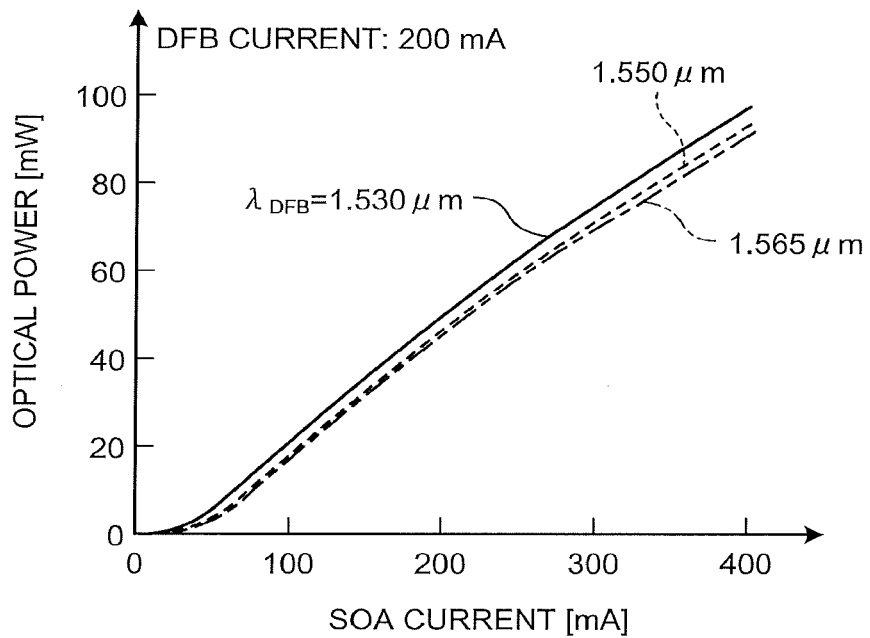
FIG. 16 is a diagram illustrating experimental results of a fourth example.
Figure 17:
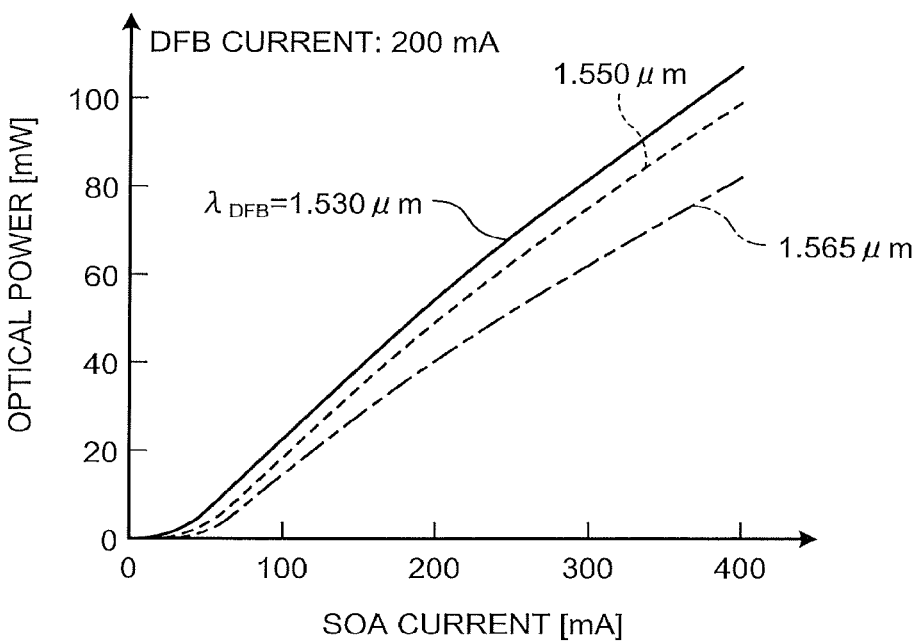
FIG. 17 is a diagram illustrating experimental results of the fourth example.

Optical power characteristics verses electric current in the device of the fourth inventive example are illustrated in FIG. 16. These results are results of carrying out measurement for each of three DFB lasers (wavelengths: 1.530 μm, 1.550 μm, and 1.565 μm) at a device temperature of 40° C. Results for optical power characteristics of the sixth comparative example obtained similarly are illustrated in FIG. 17. As illustrated therein, in the fourth inventive example, optical power of the respective DFB lasers did not largely differ from one another, but in the sixth comparative example, power at a long wavelength side laser tended to be lower. It was confirmed that this wavelength dependence is not specific to wavelength-tunable lasers, and a similar tendency was also seen in other semiconductor optical devices.

Fifth Example

Next, the fifth example will be described. As a fifth inventive example, the semiconductor optical device 401 of the fifth embodiment was manufactured.

Further, as a seventh comparative example, a semiconductor optical device (mode-locked laser), which had a similar configuration having two gain regions with the same PL peak wavelength (1.54 μm) and an undoped multiquantum well structure, was manufactured, and an oscillation spectrum thereof was compared to that of the fifth inventive example. The rest of the configuration of the seventh comparative example was the same as the configuration of the fifth inventive example.

Figure 18:
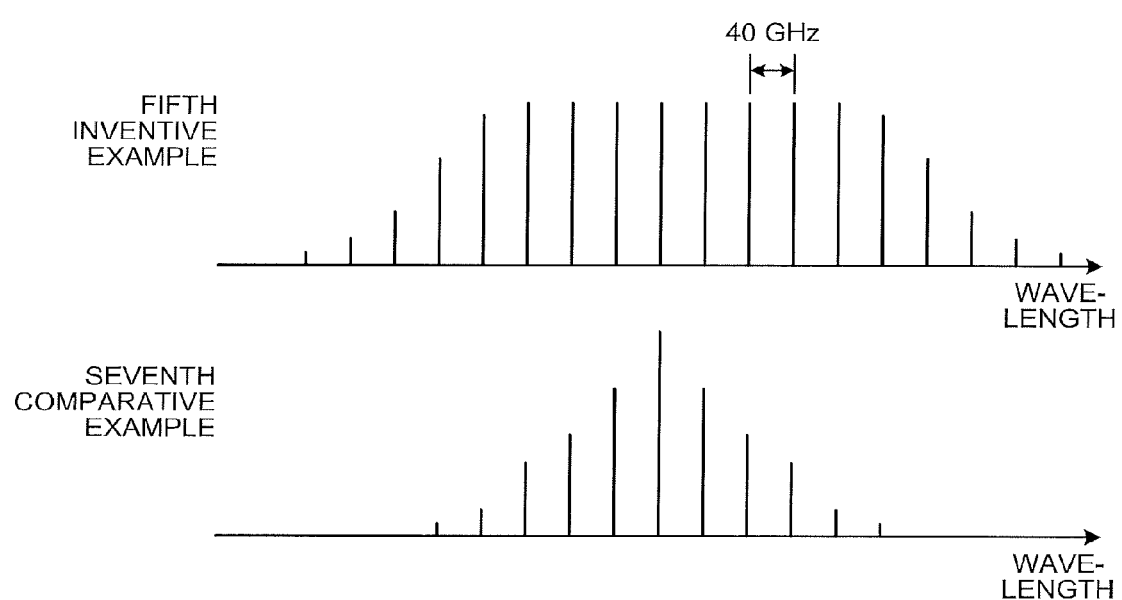
FIG. 18 is a diagram illustrating experimental results of a fifth example.

In order to cause laser oscillation, electric current is injected in long wavelength gain regions and short wavelength gain regions, and a modulation signal voltage of 40 GHz is applied to saturable absorption regions. As a result of measurement, oscillation spectra as illustrated in FIG. 18 were obtained, and for both of the configurations, the obtained oscillation spectra were spectra having peaks at equal frequency intervals of 40 GHz that was applied to the saturable absorption regions. It has been confirmed that the spectrum of the sixth inventive example had regular peak power over a broader wavelength bandwidth than the seventh comparative example 7, and that the effect of flattening the gain and increasing the gain full width was obtained.

The semiconductor optical devices according to the present disclosure demonstrate the effect of increasing the gain bandwidth even if they do not have n-type conductivity, as long as the n-type dopant has been added in their quantum well layers. Therefore, even if both of n-type and p-type dopants have been added in the quantum well layers and the conductivity type thereof is p-type, the effect of increasing the gain bandwidth is obtained.

According to the present disclosure, a semiconductor optical device having a broad gain bandwidth while having a simple configuration is able to be provided.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor optical device, comprising:
an active layer, the active layer including
a plurality of quantum well layers having gain peak wavelengths different from one another in a layering direction thereof, and
a plurality of barrier layers, wherein
the quantum well layers and the barrier layers are alternately layered over each other, and
an n-type dopant has been added in the plurality of quantum well layers having gain peak wavelengths different from one another and in the plurality of barrier layers.

2. The semiconductor optical device according to claim 1, wherein the plurality of quantum well layers having gain peak wavelengths different from one another respectively have different thicknesses or compositions.

3. The semiconductor optical device according to claim 1, wherein the number of the plurality of quantum well layers having gain peak wavelengths different from one another is two.

4. The semiconductor optical device according to claim 1, wherein
light emitted from the plurality of quantum well layers has at least a first wavelength band, and a second wavelength band that is a longer wavelength band than the first wavelength band, and
a bottom portion at a long wavelength side of the first wavelength band is superposed on a bottom portion at a short wavelength side of the second wavelength band.

5. The semiconductor optical device according to claim 1, wherein gain between a falling curve at a short wavelength side and a falling curve at a long wavelength side, in a gain curve versus wavelength of the semiconductor optical device, is positive.

6. The semiconductor optical device according to claim 1, wherein a gain curve between a falling curve at a short wavelength side and a falling curve at a long wavelength side, in a gain curve versus wavelength of the semiconductor optical device, does not become higher than the falling curve at the short wavelength side and the falling curve at the long wavelength side.

7. A semiconductor optical device, comprising:
a plurality of active layers arranged in a direction of propagation of light, the plurality of active layers including, in the direction of propagation of light,
a plurality of quantum well layers having gain peak wavelengths different from one another, and
a plurality of barrier layers, wherein
the quantum well layers and the barrier layers are alternately layered over each other, and
an n-type dopant has been added in the plurality of quantum well layers having gain peak wavelengths different from one another and in the plurality of barrier layers.

8. The semiconductor optical device according to claim 7, wherein the plurality of quantum well layers having gain peak wavelengths different from one another have different thicknesses or compositions in the direction of propagation of light.

9. The semiconductor optical device according to claim 7, wherein the number of the plurality of quantum well layers having gain peak wavelengths different from one another is two.

10. The semiconductor optical device according to claim 7, wherein
light emitted from the quantum well layers has at least a first wavelength band, and a second wavelength band that is a longer wavelength band than the first wavelength band, and
a bottom portion at a long wavelength side of the first wavelength band is superposed on a bottom portion at a short wavelength side of the second wavelength band.

11. The semiconductor optical device according to claim 7, wherein by thicknesses or compositions of the active layers being discretely varied in the direction of propagation of light, plurality of beams of light having gain peak wavelengths corresponding to the respective thicknesses or respective compositions are generated.

12. The semiconductor optical device according to claim 7, wherein the active layers have plurality of quantum well layers having gain peak wavelengths different from one another in a layering direction thereof.

13. The semiconductor optical device according to claim 7, wherein gain between a falling curve at a short wavelength side and a falling curve at a long wavelength side, in a gain curve versus wavelength of the semiconductor optical device, is positive.

14. The semiconductor optical device according to claim 7, wherein a gain curve between a falling curve at a short wavelength side and a falling curve at a long wavelength side, in a gain curve versus wavelength of the semiconductor optical device, does not become higher than the falling curve at the short wavelength side and the falling curve at the long wavelength side.

15. The semiconductor optical device according to claim 7, wherein a falling curve at a short wavelength side has a steeper degree of falling than a falling curve at a long wavelength side, in a gain curve versus wavelength of the semiconductor optical device.

16. The semiconductor optical device according to claim 7, wherein a gain curve versus wavelength of the semiconductor optical device has a single peak.

17. The semiconductor optical device according to claim 7, wherein a doping concentration of the n-type dopant is $1\times10^{17}$ cm$^{-3}$ to $5\times10^{18}$ cm$^{-3}$.

18. The semiconductor optical device according to claim 17, wherein the doping concentration of the n-type dopant is $3\times10^{17}$ cm$^{-3}$ to $3\times10^{18}$ cm$^{-3}$.

19. The semiconductor optical device according to claim 7, wherein a conductivity type of the plurality of quantum well layers added with the n-type dopant is n-type.

20. The semiconductor optical device according to claim 7, wherein a full width at half maximum of a gain spectrum of each of the plurality of quantum well layers is increased by adding the n-type dopant.

* * * * *